(12) United States Patent
Gehrke et al.

(10) Patent No.: US 9,622,370 B2
(45) Date of Patent: Apr. 11, 2017

(54) MODULAR ARRANGEMENT WITH AT LEAST ONE BASE MODULE

(71) Applicant: Euchner GmbH + Co. KG, Leinfelden-Echterdingen (DE)

(72) Inventors: Mike Gehrke, Hochdorf (DE); Jörg Klaiber, Hildrizhausen (DE)

(73) Assignee: Euchner GmbH + Co. KG, Leinfelden-Echterdingen (DE)

( * ) Notice: Subject to any disclaimer, the term of this patent is extended or adjusted under 35 U.S.C. 154(b) by 0 days.

(21) Appl. No.: 14/975,716

(22) Filed: Dec. 19, 2015

(65) Prior Publication Data

US 2016/0219740 A1 Jul. 28, 2016

(30) Foreign Application Priority Data

Jan. 27, 2015 (DE) .................. 10 2015 101 133

(51) Int. Cl.
| | |
|---|---|
| H05K 7/00 | (2006.01) |
| H05K 7/02 | (2006.01) |
| H01H 27/00 | (2006.01) |
| H05K 5/02 | (2006.01) |
| H05K 7/10 | (2006.01) |
| F16P 3/08 | (2006.01) |
| H01R 9/24 | (2006.01) |
| H01R 9/26 | (2006.01) |
| H01R 24/86 | (2011.01) |

(52) U.S. Cl.
CPC ............ *H05K 7/026* (2013.01); *H01H 27/00* (2013.01); *H05K 5/023* (2013.01); *H05K 7/023* (2013.01); *H05K 7/10* (2013.01); *F16P 3/08* (2013.01); *H01R 9/2408* (2013.01); *H01R 9/2675* (2013.01); *H01R 24/86* (2013.01)

(58) Field of Classification Search
CPC ......... H05K 7/02; H05K 1/142; G06F 13/409
USPC .................................. 361/728–730
See application file for complete search history.

(56) References Cited

U.S. PATENT DOCUMENTS

| | | | | |
|---|---|---|---|---|
| 5,411,534 A * | 5/1995 | Dieken | ............... | A61B 5/0404 128/908 |
| 5,645,434 A * | 7/1997 | Leung | .................. | H01R 31/005 361/735 |
| 6,036,505 A * | 3/2000 | Zell | ........................ | H05K 1/145 439/74 |
| 6,736,658 B2 * | 5/2004 | Milan | ................. | G06F 13/4095 363/146 |
| 6,848,913 B2 * | 2/2005 | Wang | .................... | H01R 33/94 361/788 |
| 7,352,589 B2 * | 4/2008 | Clidaras | .............. | H05K 7/1429 361/748 |
| 9,019,718 B2 * | 4/2015 | Bdeir | .................... | H01R 11/30 361/792 |

* cited by examiner

*Primary Examiner* — Hung S Bui
(74) *Attorney, Agent, or Firm* — Michael Soderman (57) ABSTRACT

The invention relates to a modular arrangement with at least one base module that has a connection module on two different sides in each case and with at least one functional module with at least one connection module. The connection modules of the base module are designed to be rotationally invariant with regard to their mechanical and electrical connections, so a choice of the first or second connection module of the base module can be brought into contact with the connection module of the functional module by rotating the base module.

14 Claims, 8 Drawing Sheets

MODULAR ARRANGEMENT WITH AT LEAST ONE BASE MODULE

CROSS REFERENCE TO RELATED APPLICATIONS

This application claims the priority of German Application No. DE 10 2015 101 133.6 filed on Jan. 27, 2015; this application is incorporated by reference herein in its entirety.

BACKGROUND

The invention relates to a modular arrangement in accordance with the preamble of claim 1.

Modular arrangements of the type at issue are comprised of one or more base modules that each have a connection module on each of two different sides, as well as one or more functional modules with at least one connection module. The base modules and the functional modules generally form electronics modules that have specified functionalities. These electronics modules can be connected via connection modules, which are designed in the form of plugs and sockets, for instance, that are combined to form a functional unit.

Modular arrangements of this type can, as an example, constitute safety systems, in particular locking safety systems. One system of this type is the MGB safety system of the company Euchner, for example. This safety system ensures that movable, separating protective equipment is reliably kept closed, in particular protective doors, and that access is consequently secure to fenced-in, hazardous areas that are critical for safety.

This locking safety system is comprised of a locking module that is arranged on a handle module. These modules serve to reliably keep the protective door closed. The door handle of the handle module can be held in the closed position via spring force and unlocked via magnetic force. Alternatively, the door handle can be held in the closed position via magnetic force and unlocked via spring force.

The locking safety system has, moreover, a control module and a bus module in the form of functional modules that can be connected to the locking module. The control module has a control unit with several buttons and knobs. The bus module serves to connect the locking safety system to an external bus system.

The individual modules are connected via connection modules such as plugs and sockets; flat-ribbon cables that go into the individual modules run out of the connection modules.

A major drawback of this locking safety system is that the entire locking safety system has to be sent back to the manufacturer for repair purposes when a defect arises in a module.

Another drawback of the locking safety system is that the construction expenses for an adaptation to different configurations are undesirably high. Different configurations especially arise via different arrangements of the protective door relative to the locking safety system. An arrangement of a handle module has to be provided on the right-hand side or on the left-hand side of the locking module depending on the arrangement of the protective door. To cover these configurations, different variants of the locking module have to be provided that have the different designs for an attachment of the handle module on the right-hand side or on the left-hand side.

SUMMARY

The invention relates to a modular arrangement (1) with at least one base module that has a connection module on two different sides in each case and with at least one functional module with at least one connection module. The connection modules of the base module are designed to be rotationally invariant with regard to their mechanical and electrical connections, so a choice of the first or second connection module of the base module can be brought into contact with the connection module of the functional module by rotating the base module.

DETAILED DESCRIPTION

The invention is based on the problem of providing a modular arrangement of the type mentioned at the outset that has a high level of functionality with a simple design.

The elements of claim 1 are specified to solve this problem. Advantageous embodiments and useful design developments of the invention are described in the dependent claims.

The invention relates to a modular arrangement with at least one base module that has a connection module on two different sides in each case and with at least one functional module with at least one connection module. The connection modules of the base module are designed to be rotationally invariant with regard to their mechanical and electrical connections, so a choice of the first or second connection module of the base module can be brought into contact with the connection module of the functional module by rotating the base module.

Because of the rotationally invariant design of the connection modules of the base module, it can be connected to the assigned functional module in two different rotary positions. Two different arrangements of functional modules and base modules can therefore be realized with one and the same base module, and different applications can consequently be realized without having to provide different variants of base modules for that. A high level of flexibility and functionality of the modular arrangement as per the invention is therefore obtained.

It is especially advantageous when the connection modules of the base module are designed to be rotationally symmetric with regard to a 180° rotation of the base module.

The rotational invariance of the connection modules of the base module is advantageously achieved because the connections of the two connection modules corresponding to one another in the base module are connected to one another via electrical lines.

Another important aspect of the modular arrangement as per the invention is that the connection modules form a modular system; connection modules can be exchangeably mounted on the base module(s) and/or functional module(s).

Different connection configurations can therefore be realized for the modular arrangement with little effort.

A further advantage is that the entire modular arrangement does not have to be replaced when individual modules are defective; instead, only individual modules have to be replaced, which substantially reduces the expenses for repairs that arise.

In accordance with an especially advantageous design form of the invention, the base modules and/or functional modules that are connected via connection modules communicate via a data-bus system.

The data-bus system is designed in such a way that circuit boards in which bus lines of the data-bus system are laid are provided in the base module or functional module, or each base module or functional module.

The connection modules, adapted for this, have contact interfaces for connections to the circuit boards of the base modules and/or functional modules.

The contact interfaces are advantageously designed in the form of spring contacts.

The individual modules of the modular arrangement communicate with the data-bus system as the internal bus system of the modular arrangement. The data-bus system operates completely independently from external bus systems to which the modular arrangement may be connected. Expensive wiring within the modules is no longer necessary because of the design of the data-bus system in such a way that the bus lines are routed in the circuit boards of the modules. This advantage is reinforced by the fact that the contact interfaces of the connection modules can be directly brought into contact on the circuit boards. It is especially advantageous when the contact interfaces are made up of functional modules that can make electrical contact simply by pressing contact points on the circuit boards. Since all of the modules have interfaces adapted to the contact interfaces of the connection modules, the modularity of the overall modular arrangement is thereby increased even more because arbitrary modules can be combined with one another without design changes, for instance a modified routing of cables, having to be made in the modules for this.

The connection modules are designed in the form of plugs or sockets in the modular arrangement as per the invention.

A plug and a socket are directly connected with one another via a cable.

When there is a direct connection of a plug of a module and a socket of a different module, the modules are directly connected with one another and adjacent to one another. If, in contrast, a cable is also provided between the plug and the socket, the modules can be located at a spatial distance from one another.

The plugs and sockets can be designed with different construction variants here; the diversity of variations of the modular arrangement can be increased even further because of that.

In accordance with an advantageous design form, each plug has a standardized connection element with an external thread. Each socket has a base body with a contact interface; a first upper part with a hole with an internal thread into which cable plugs and the like can be screwed and a second upper part with a hole without an internal thread that is designed to accommodate the connection component of the plug are allocated to the base body.

Two different connection possibilities can be realized with minor expense because of the choice of an attachment of one of the upper parts to the base body. The fact that one and the same base body of the socket can be used for both upper parts is especially advantageous here.

The individual modules of the modular arrangement as per the invention, meaning the base modules and functional modules, can generally be made up of electronics modules that can fulfill different functions, so the modular arrangement created in that way can be used in industrial applications of all types.

In accordance with an advantageous design form, the modular arrangement constitutes a safety system, in particular a locking safety system.

The locking safety system has at least one base module in the form of a locking module. Furthermore, the locking safety system has a functional module in the form of a control module and/or a functional module in the form of a bus module.

The locking module has a holder for a handle module; because of the rotationally invariant design, the connection module of the locking module in one rotational position of a connection module of the locking module is connected to a connection module of a functional module and a handle module is fastened to the holder on the right-hand side. In a second rotary position, the second connection module of the locking module is fastened to the connection module of the functional module and a handle module is fastened to the holder on the left-hand side.

Because of the rotationally invariant design of the locking module, it can consequently be used in an unchanged way for a handle module that connects on the right-hand side and a handle module that connects on the left-hand side; the number of components of the locking safety system required to realize these variants can be kept extremely small because of that.

BRIEF DESCRIPTION OF THE DRAWINGS

The invention will be explained with the aid of the drawings below. The following are shown in the figures.

DETAILED DESCRIPTION OF THE PREFERRED EMBODIMENT

Figure 1:
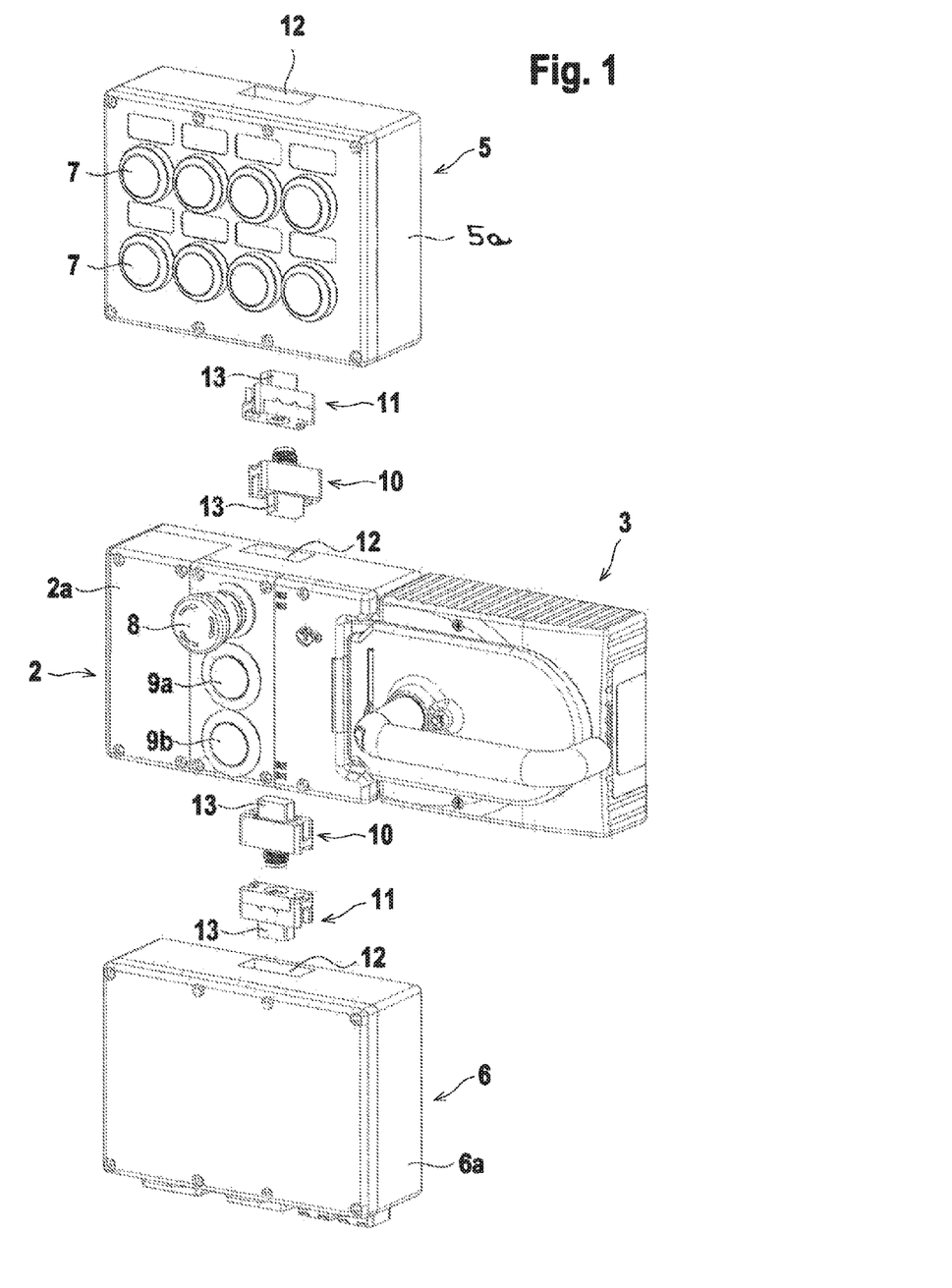
FIG. 1: First variant of an example of the modular arrangement as per the invention.
Figure 2:
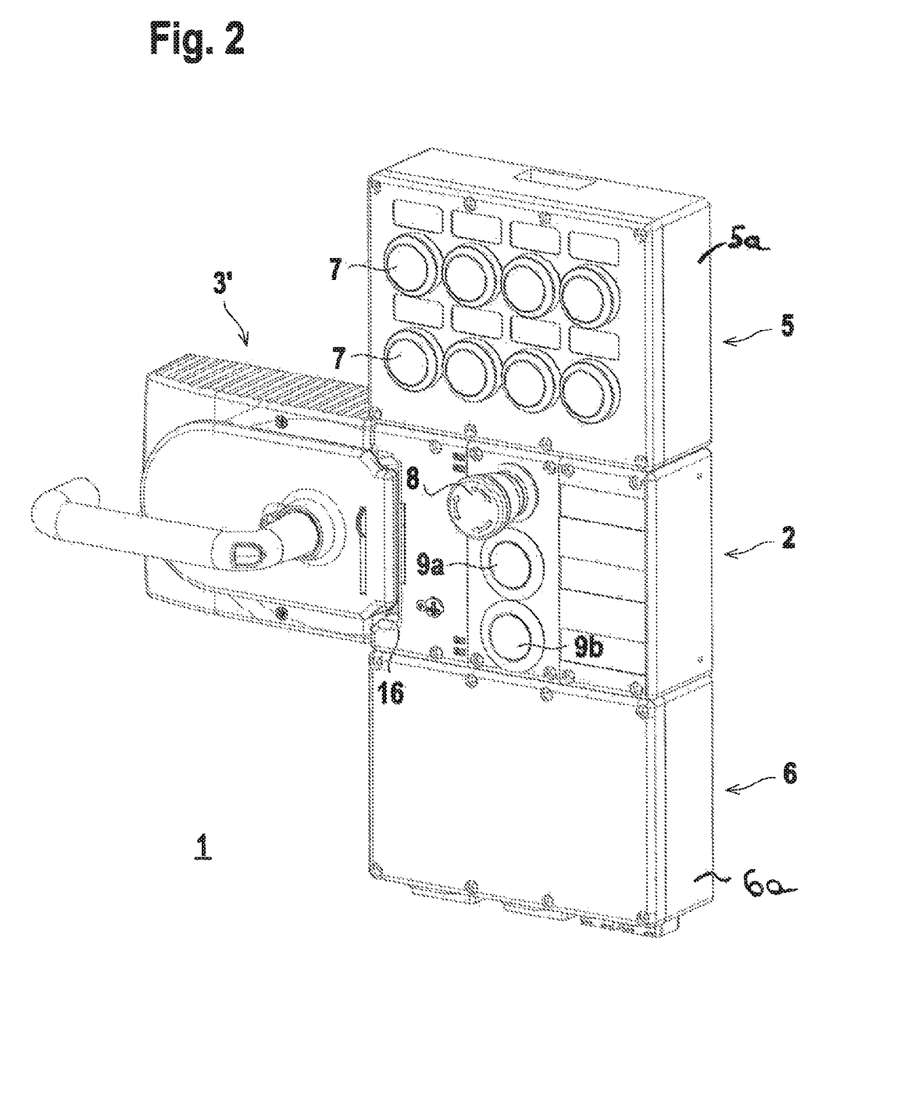
FIG. 2: Second variant of the modular arrangement in accordance with FIG. 1.
Figure 3:
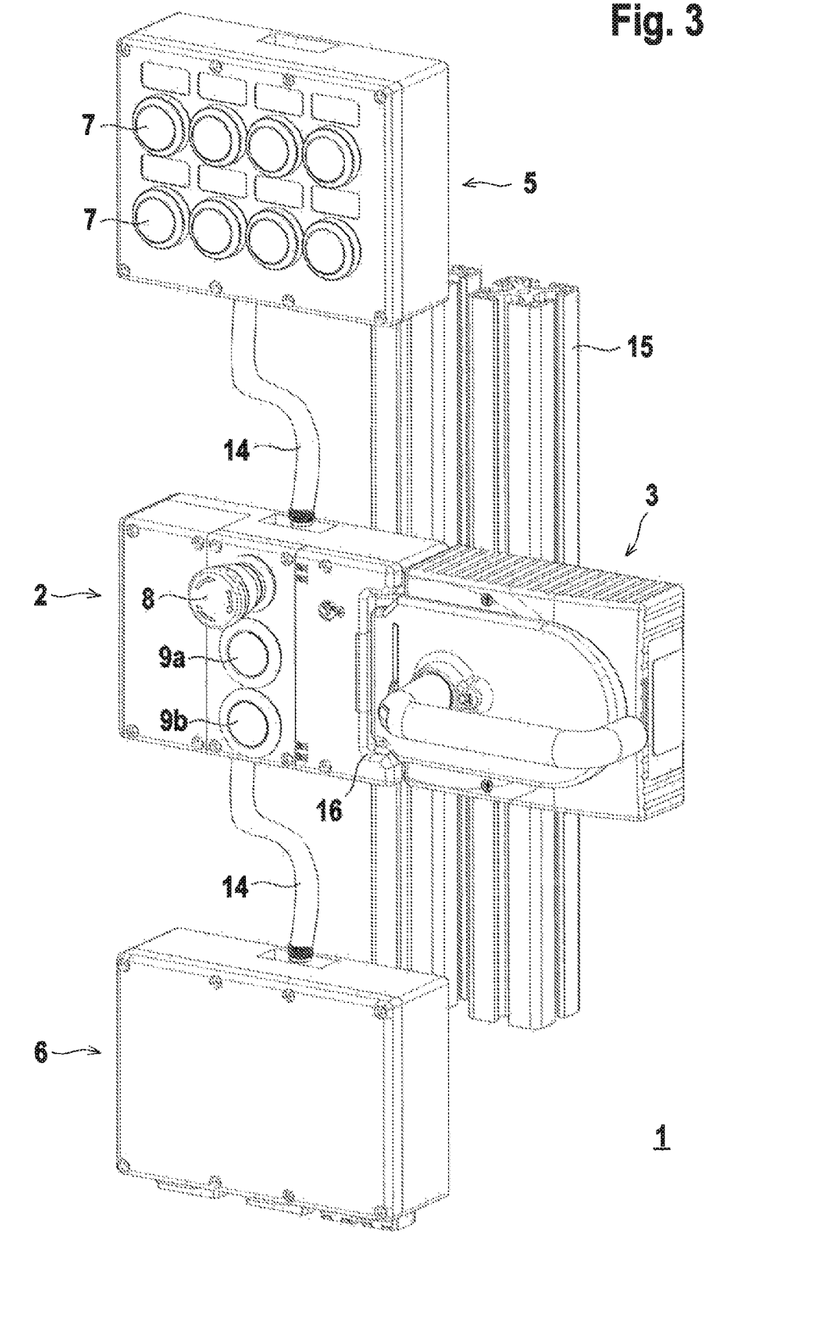
FIG. 3: Third variant of the modular arrangement in accordance with FIG. 1.

FIGS. 1 to 3 show three variants of an example of the modular arrangement 1 as per the invention. The modular arrangement 1 constitutes in the instant case a safety system, specifically a locking safety system, that has a locking module 2 as a base module. In the arrangement of FIG. 1, a right-hand handle module 3 is arranged on the right-hand side of the locking module 2. In the arrangement of FIG. 2, a left-hand handle module 3' is arranged on the left-hand side of the same locking module 2. The handle module 3, 3' has a door handle 4 in both cases.

The locking module 2 and the handle module 3, 3' form a functional unit that ensures that a protective door or the like is kept closed. The door handle 4 can be kept in the closed position with spring force in principle and unlocked via magnetic force. In the instant case, the door handle 4 is kept in the closed position via magnetic force that is generated via magnets arranged in the locking module 2 and unlocked via spring force.

The modular arrangement 1 of FIGS. 1 to 3 has, moreover, a control module 5 as a first functional module and a bus module 6 as a second functional module. The control module 5 constitutes a control unit and has several buttons 7 as control elements. The locking module 2 itself has an emergency stop button 8 and other buttons 9a, 9b for operation of the safety system. The bus module 6 serves to connect to the safety system to an external bus system.

The modular arrangement 1 of FIGS. 1 to 3 can, in general, also be expanded to the effect that it will have several locking modules 2 with handle modules 3, 3' or also more functional modules such as bus modules 6 or control modules 5.

The electrical connection between the base module and the functional module is brought about via connection modules that are designed in the form of plugs 10 or sockets 11.

A connection module of this type is used for assembly to the base module or a functional module in a recess 12 in its housing 2a, 5a, 6a. When the connection module is used, it makes electrical contact with a circuit board, which is not shown, in the base module or in the functional module. Bus lines of a data-bus system that forms an internal bus system of the safety system and that operates independently of external bus systems are laid in the circuit board. The data-bus system can, in particular, be designed in the form of a CAN bus. Each connection module has a contact interface 13 to make contact with the circuit boards.

The connection modules form a modular system that can optionally be combined with the base module and the functional module. In so doing, a plug 10 and a socket 11 can be used to directly connect the locking module 2 to a functional module, as shown in FIGS. 1 and 2. Alternatively, a cable 14 can be provided between a plug 10 and a socket 11 so that the locking module 2 and the functional modules can be positioned at a distance to one another.

It is advantageous when the modules of the safety system are fastened to a profile rail 15, which is shown in FIG. 3.

In accordance with the invention, the locking module 2, as the base module of the modular arrangement 1, has two connection modules on opposite sides that are rotationally invariant in terms of their electrical connections with regard to a rotation of the locking module 2 by 180°. This means that the locking module 2 forms completely identical connection interfaces to the control module 5 and to the bus module 6 both in a first rotary position (shown in FIG. 1) and in a second rotary position rotated by 180° with regard to that (shown in FIG. 2), and it can therefore be connected in an identical manner in both rotary positions to the control module 5 and the bus module 6 without additional bus circuits. This means, in turn, that one and the same locking module 2 can be used to both connect the right-hand handle module 3 (FIG. 1) and to connect the left-hand handle module 3' (FIG. 2). In the first case (FIG. 1), a holder 16 of the locking module 2 opens on the right-hand side to accommodate the right-hand handle module 3. In the second case (FIG. 2), the holder 16 opens on the left-hand side to accommodate the left-hand handle module 3'.

Figure 4:
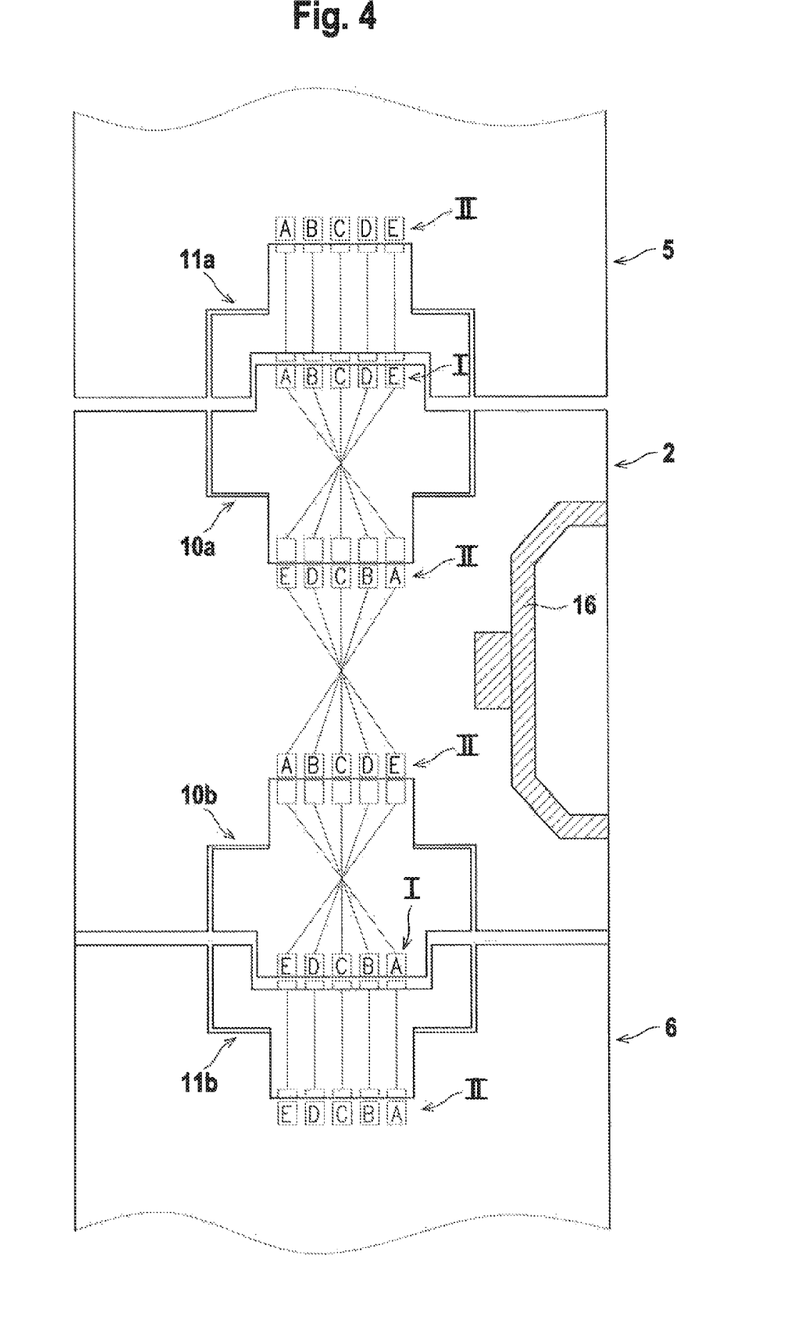
FIG. 4: Schematic diagram of the electrical connections of the individual connection modules of the modular arrangement in accordance with FIG. 1.
Figure 5:
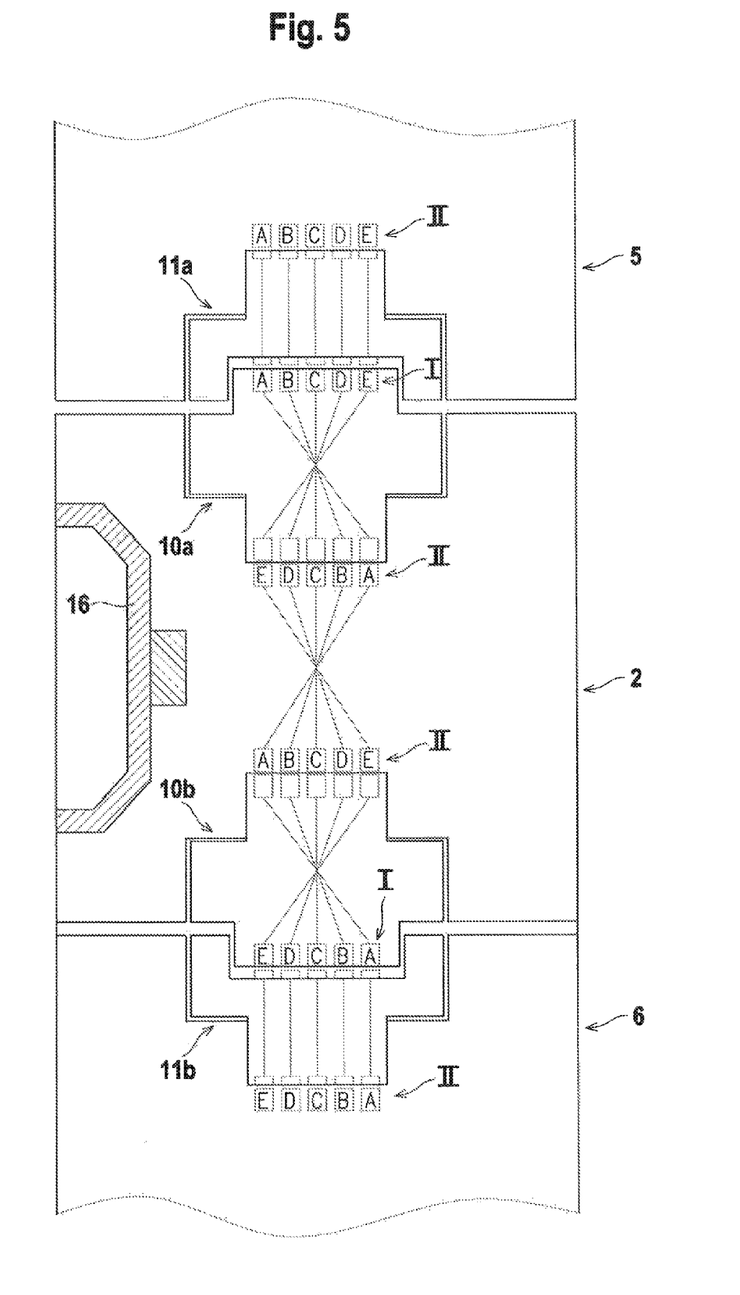
FIG. 5: Schematic diagram of the electrical connections of the individual connection modules of the modular arrangement in accordance with FIG. 2.

The rotational invariance of the electrical connections of the connection modules of the locking module 2 is obtained with the connection arrangements shown in FIGS. 4 and 5.

FIGS. 4 and 5 schematically show the locking module 2 with two plugs 10a, 10b as the connection module, and the control module 5 and the bus module 6, each with a socket 11a, 11b, as connection modules. Alternatively, the locking module 2 can also be equipped with two sockets 11a, 11b. Plugs 10 would then be provided in a corresponding fashion in the control module 5 and in the bus module 6.

Each socket 11a, 11b and each plug 10a, 10b of the arrangement of FIGS. 4 and 5 have external connection contacts A, B, C, D, E (designated as I in each case) that are assigned to the respective connection contact A, B, C, D, E of the allocated connection module on the opposite side. Furthermore, each socket 11a, 11b and each plug 10a, 10b of the arrangement of FIGS. 4 and 5 have internal connection contacts A, B, C, D, E (designated as II in each case) that are each connected to the inner circuit board of the locking module 2, control module 5 or bus module 6 as the case may be.

With regard to the sockets 11a, 11b integrated into the control module 5 or the bus module 6, the internal connection contacts II and the external connection contacts I are connected via lines running in a straight line in each case, so the arrangement A, B, C, D, E of the internal connection contacts II corresponds to the arrangement A, B, C, D, E of the external connection contacts I.

With regard to the plugs 10a, 10b in the locking module 2, the internal connection contacts II are connected via crossed lines with the external connection contacts I, so the sequence of internal connection contacts II (A, B, C, D, E) is reversed with regard to the sequence of external connection contacts (E, D, C, B, A). Furthermore, the internal connection contacts II of the plugs 10a, 10b are connected via crossed lines; the sequence of the connection contacts II of the plug 10b (A, B, C, D, E) is reversed with regard to the sequence of the connection contacts I of the plug 10a (E, D, C, B, A).

Because of this wiring of the connection contacts I, II of the plugs 10a, 10b, their connections are rotationally invariant in terms of a rotation of 180°, as a comparison of FIGS. 4 and 5 shows. With regard to the arrangement in accordance with FIG. 4, the locking module 2 is in a first rotary position in which the holder 16 for the connection of a right-hand handle module 3 is on the right-hand side. With regard to the arrangement in accordance with FIG. 5, the locking module 2 is in a second rotary position rotated by 180° with respect to the first rotary position in which the holder 16 for the connection of a left-hand handle module 3' is on the left-hand side. Completely identical connections of the plugs 10a, 10b to the sockets 11a, 11b of the control module 5 or the bus module 6 exist in both arrangements.

Figure 6:
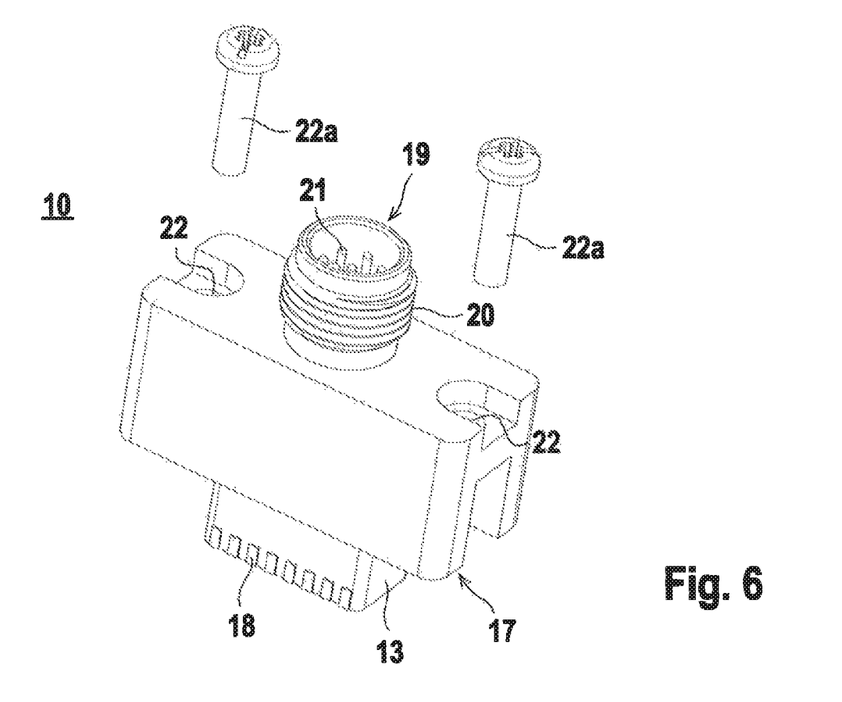
FIG. 6: Embodiment of a plug as a connection module for the modular arrangement of FIGS. 1 to 3.
Figure 7:
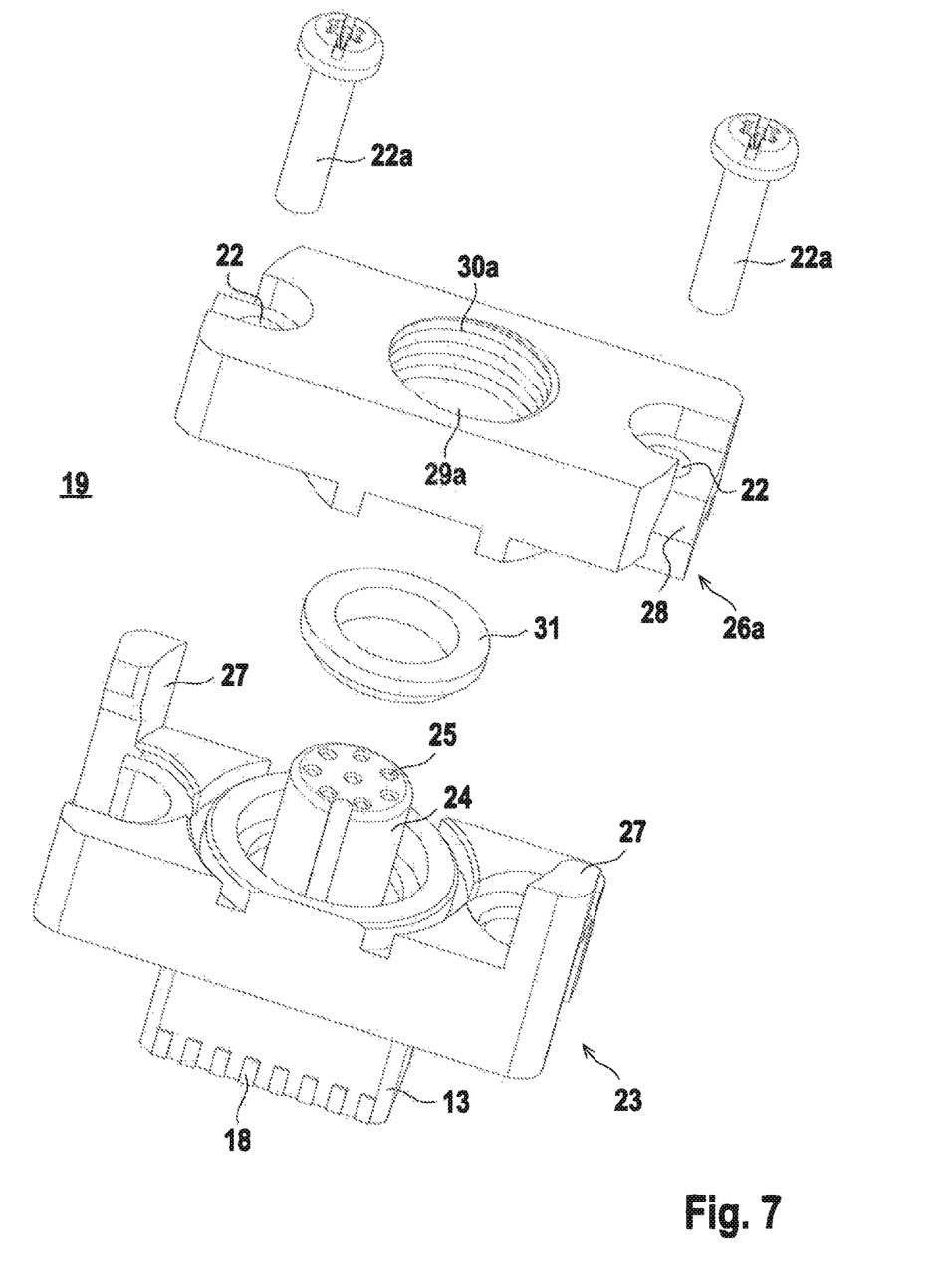
FIG. 7: First variant of a socket as a connection module for the modular arrangement of FIGS. 1 to 3.
Figure 8:
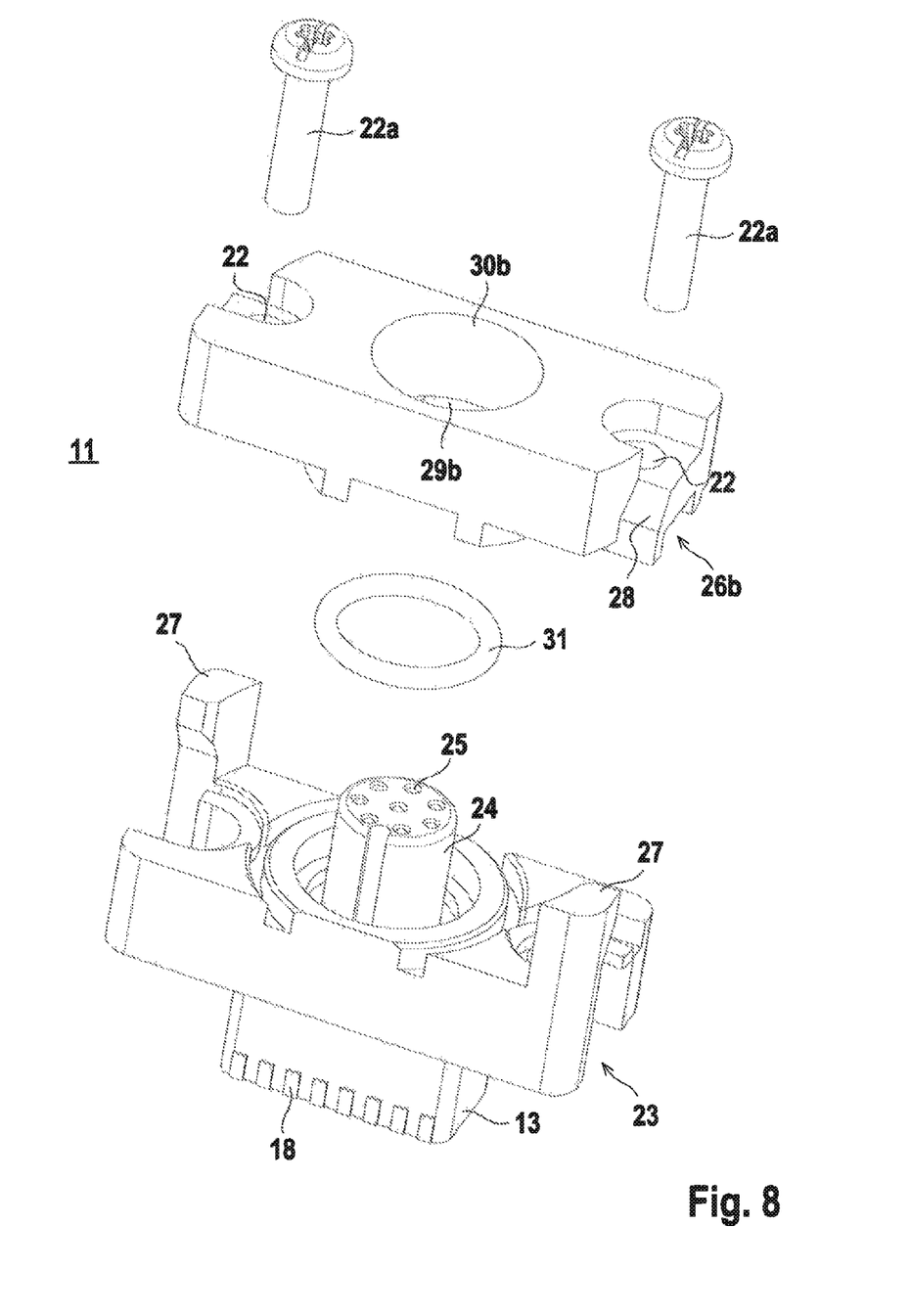
FIG. 8: Second variant of a socket as a connection module for the modular arrangement of FIGS. 1 to 3.

FIGS. 6 to 8 show a detailed view of the design of the connection modules for the modular arrangement 1 of FIGS. 1 to 3. FIG. 6 shows an embodiment of a plug 10. The plug 10 has a plug base body 17; the contact interface 13 comes out on the bottom of it. The contact interface 13 has spring contacts 18; contact can be made with them to contact pads of the circuit board in the locking module 2. A connection component 19 comes out at the top; it constitutes a standard M12 interface in this case. The connection component 19 is designed as a hollow cylinder and has an external thread 20 on the outside, which is an M12 thread in this case. There are several contact pins 21 in the interior of the connection component 19. The plug base body 17 has two lateral mounting holes 22 through which screws 22a can be inserted to fix the plug 10 in place on the locking module 2. Two variants of a socket 11 that are shown in FIGS. 7 and 8 are assigned to the plug 10 in accordance with FIG. 6. The socket 11 has a base body 23 identical for both variants; the contact interface 13 with the spring contacts 18 is provided on the bottom of it, corresponding to the design of the plug 10. A cylindrical connector 24 with contact elements 25 in the form of contact holes into which the contact pins 21 of the plug 10 are inserted is located on the top of the base body 23.

Two different upper parts 26a, 26b that are shown in FIGS. 7 and 8 are assigned to the base body 23 to create two different socket variants. Both of the upper parts 26a, 26b have the same external contour, so a choice of one of the upper parts 26a, 26b can be put on the base body 23. To fix these parts in place, the base body 23 has projections 27 that can be put on cutouts 28 in the upper parts 26a, 26b that are designed to be complementary with regard to this. Furthermore, the upper parts 26a, 26b have two lateral mounting holes 22, analogous to those of the plug 10, into which the screws 22a can be inserted so as to be able to fix the socket 11 in place on the control module 5 or the bus module 6.

The upper parts 26a, 26b differ with regard to the design of central holes 29a, 29b that surround the connector 24 of the base body 23 with play when the upper part 26a, 26b is put on the base body 23. The hole 29a of the upper part 26a bordered with an internal thread 30a, where as the hold 29b of the upper part 26b is bordered with a smooth wall element 30b of the upper part 26b.

The corresponding upper part 26a, 26b is put on the base body 23 with a seal 31 in the form of an O ring to form the socket 11.

Sockets 11 with different functionality are obtained in accordance with the differently designed holes 29a, 29b. Cable plugs and the like can be screwed into the socket 11 with the upper part 26a in accordance with FIG. 7. On the other hand, the socket 11 with the upper part 26b in accordance with FIG. 8 is put on the plug 10 in accordance with FIG. 6; the wall element 30b surrounding the hole 29b then surrounds the connection component 19 of the plug 10 with a slight amount of play.

LIST OF REFERENCE NUMERALS (1) Modular arrangement
(2) Locking module
(2a) Housing
(3) Right-hand handle module
(3') Left-hand handle module
(4) Door handle
(5) Control module
(5a) Housing
(6) Bus module
(6a) Housing
(7) Buttons
(8) Emergency stop button
(9a, b) Buttons
(10a, b) Plug
(11a, b) Socket
(12) Recess
(13) Contact interface
(14) Cable
(15) Profile rail
(16) Holder
(17) Plug base body
(18) Spring contact
(19) Connection component
(20) External thread
(21) Contact pin
(22) Mounting hole
(22a) Screws
(23) Base body
(24) Connector
(25) Contact element
(26a, b) Upper part
(27) Projection
(28) Cutout
(29a, b) Hole
(30a) Internal thread
(30b) Wall element
(31) Seal (I) Connection contact A, B, C, D, E
(II) Connection contact A, B, C, D, E

The invention claimed is:

1. Modular arrangement (1) with at least one base module having a connection module on each of two different sides and at least one functional module with at least one connection module, characterized in that the connection module of the base module is designed to be rotationally invariant with regard to its mechanical and electrical connections so that by rotating the base module a choice of its first or second connection module can make contact with the connection module of the functional module, wherein said modular arrangement forms a locking safety system, wherein the base module is designed to be a locking module (2), the locking module (2) has a holder (16) for a handle module (3, 3'), and, because of the rotationally invariant design of the connection module, the locking module (2) is connected in a first rotary position of a connection module of the locking module (2) to a connection module of a functional module and a handle module (3) is attached to the right-hand side of the holder (16), and, in a second rotary position, the second connection module of the locking module (2) is connected to the connection module of the functional module and a handle module (3') is attached to the left-hand side of the holder (16).

2. Modular arrangement according to claim 1, characterized in that the connection modules of the base module are designed to be rotationally symmetric with regard to a rotation of 180° of the base module.

3. Modular arrangement according to claim 2, characterized in that connections of the two connection modules in the base module that correspond to one another are connected to each other via electrical lines.

4. Modular arrangement according to claim 1, characterized in that the connection modules form a modular system, wherein connection modules can be mounted in an exchangeable fashion on the base module(s) and/or functional module(s).

5. Modular arrangement according to claim 1, characterized in that the base modules and/or functional modules connected via connection modules communicate via a data-bus system.

6. Modular arrangement according to claim 5, characterized in that circuit boards in which bus lines of the data-bus system are laid are provided in the or each base module or functional module.

7. Modular arrangement according to claim 6, characterized in that the connection modules have contact interfaces (13) for connection to the circuit boards of the base modules and/or functional modules.

8. Modular arrangement according to claim 7, characterized in that the contact interfaces (13) are designed in the form of spring contacts (18).

9. Modular arrangement according to claim 8, characterized in that each plug (10a, 10b) has a standardized connection component (19) with an external thread (20).

10. Modular arrangement according to claim 1, characterized in that the connection modules are designed in the form of plugs (10, 10a, 10b) or sockets (11, 11a, 11b).

11. Modular arrangement according to claim 10, characterized in that a plug (10a, 10b) and a socket (11a, 11b) are directly connected to one another via a cable (14).

12. Modular arrangement according to claim 1, characterized in that the locking safety system has a functional module in the form of a control module (5) and/or a functional module in the form of a bus module (6).

13. Modular arrangement (1) with at least one base module having a connection module on each of two different sides and at least one functional module with at least one connection module, characterized in that the connection module of the base module is designed to be rotationally invariant with regard to its mechanical and electrical connections so that by rotating the base module a choice of its first or second connection module can make contact with the connection module of the functional module, wherein the base modules and/or functional modules connected via connection modules communicate via a data-bus system, circuit boards in which bus lines of the data-bus system are laid are provided in the or each base module or functional module, the connection modules have contact interfaces (13) for connection to the circuit boards of the base modules and/or functional modules, the contact interfaces (13) are designed in the form of spring contacts (18) and each plug (10a, 10b) has a standardized connection component (19) with an external thread (20), and wherein each socket (11, 11a, 11b) has a base body (23) with a contact interface (13), wherein a first upper part (26a) with a hole (29a) with an internal thread (30a) and a second upper part (26b) with a hole (29b) without an internal thread (30a) are assigned to the base body (23).

14. Modular arrangement according to claim 13, characterized in that either one upper part (26a, 26b) or the other, as a choice, can be fixed in place on the base body (23) of the socket (11, 11a, 11b).

* * * * *